(12) United States Patent
Jang et al.

(10) Patent No.: US 10,440,659 B2
(45) Date of Patent: Oct. 8, 2019

(54) METHOD AND DEVICE FOR ENCODING IN WIRELESS COMMUNICATION SYSTEM

(71) Applicants: Samsung Electronics Co., Ltd, Gyeonggi-do (KR); Research & Business Foundation Sungkyunkwan University, Gyeonggi-do (KR)

(72) Inventors: Min Jang, Gyeonggi-do (KR); Sang-Hyo Kim, Seoul (KR); Jong-Hwan Kim, Gyeonggi-do (KR); Hyunseok Ryu, Gyeonggi-do (KR); Wonjun Hwang, Gyeonggi-do (KR); Eun Chong Baek, Gyeonggi-do (KR); Kyungmin Lee, Gyeonggi-do (KR)

(73) Assignees: Samsung Electronics Co., Ltd., Suwon-si (KR); Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 15/389,344

(22) Filed: Dec. 22, 2016

(65) Prior Publication Data

US 2017/0181104 A1 Jun. 22, 2017

(30) Foreign Application Priority Data

Dec. 22, 2015 (KR) ........................ 10-2015-0184251

(51) Int. Cl.
*H03M 13/29* (2006.01)
*H04L 1/00* (2006.01)
(Continued)

(52) U.S. Cl.
CPC ......... *H04W 52/241* (2013.01); *H03M 13/13* (2013.01); *H03M 13/6306* (2013.01);
(Continued)

(58) Field of Classification Search
CPC . H03M 13/13; H03M 13/1575; H04W 24/02; H04W 72/085; H04W 88/06
See application file for complete search history.

(56) References Cited

U.S. PATENT DOCUMENTS 9,667,362 B2 * 5/2017 Ihm ....................... H04L 1/0026
2014/0208183 A1 7/2014 Mahdavifar et al.
(Continued)

OTHER PUBLICATIONS

Mostafa El-Khamy, et al., "HARQ Rate-Compatible Polar Codes for Wireless Channels", Aug. 31, 2015, Department of Electrical and Computer Engineering, University of California, Davis, California, 6 pages.

*Primary Examiner* — Gary Lafontant

(57) ABSTRACT

The present disclosure relates to a $5^{th}$ Generation (5G) or a pre-5G communication system provided to support a higher data transmission rate than a system beyond a $4^{th}$ Generation (4G) communication system such as Long Term Evolution (LTE). The purpose of the present disclosure is to maximize adaptive transmission performance by designing a puncturing order and a repetition order individually in optimized order. An operation method of a transmission device for adaptive transmission of a codeword according to an embodiment of the present disclosure includes generating a codeword using a polar code and transmitting a packet including at least one codeword indicated by a repetition order when bit repetition is needed. The repetition order is determined based on at least one of channel polarization or channel quality information.

20 Claims, 14 Drawing Sheets

(51) Int. Cl.

| | | |
|---|---|---|
| | *H04W 52/24* | (2009.01) |
| | *H04W 76/10* | (2018.01) |
| | *H04L 12/26* | (2006.01) |
| | *H04W 52/44* | (2009.01) |
| | *H03M 13/13* | (2006.01) |
| | *H03M 13/00* | (2006.01) |
| | *H04B 17/336* | (2015.01) |

(52) U.S. Cl.
CPC ... *H03M 13/6356* (2013.01); *H03M 13/6362* (2013.01); *H04L 43/16* (2013.01); *H04W 52/44* (2013.01); *H04W 76/10* (2018.02); *H04B 17/336* (2015.01); *H04L 43/0847* (2013.01)

(56) References Cited

U.S. PATENT DOCUMENTS

2015/0358113 A1* 12/2015 Callard ................ H04W 28/04
                                                          714/776
2016/0182187 A1*  6/2016 Kim .................... H03M 13/09
                                                          714/807
2016/0285479 A1*  9/2016 El-Khamy ........ H03M 13/6368
2017/0047947 A1*  2/2017 Hong ................ H03M 13/2906

* cited by examiner

METHOD AND DEVICE FOR ENCODING IN WIRELESS COMMUNICATION SYSTEM

CROSS-REFERENCE TO RELATED APPLICATION(S) AND CLAIM OF PRIORITY

This application claims the priority under 35 U.S.C. § 119(a) to Korean Application Serial No. 10-2015-0184251, which was filed in the Korean Intellectual Property Office on Dec. 22, 2015, the entire content of which is hereby incorporated by reference.

TECHNICAL FIELD

The present disclosure relates to a method and device for encoding in a wireless communication system.

BACKGROUND

To meet the demand for wireless data traffic having increased since deployment of 4 G communication systems, efforts have been made to develop an improved 5G or pre-5G communication system. Therefore, the 5G or pre-5G communication system is also called a 'Beyond 4 G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

An adaptive transmission system may be divided into initial transmission and retransmission after the initial transmission. The retransmission may be performed when an error has occurred in previous transmission and a Negative ACKnowledge (NACK) message is thus received from a reception terminal. When the initial transmission is performed, a transmission device performs transmission using a coding rate determined based on channel information. The transmission device may increase a decoding success rate when the retransmission is performed at the later time, by additionally transmitting a parity. A representative adaptive transmission system is a technology called a Hybrid Automatic Repeat-Request (HARQ).

The transmission device may be able to perform adaptive transmission through a circular buffer after applying interleaving to a codeword generated by polar coding. The interleaving may be available in an interleaver. The interleaver arranges bits to be punctured and puts them in a later order so as to enable the bits to be sequentially transmitted in the circular buffer. However, in a conventional system, the interleaver is designed to interleave a codeword in consideration of puncturing only. Therefore, there is a problem in which transmission optimized for repetition cannot be guaranteed when transmission is repeatedly performed after completion of transmission of punctured bits.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide a device and method for data encoding in a wireless communication system.

Another embodiment provides a device and method for data encoding using a polar code in a wireless communication system.

Still another embodiment provides a transmission device and method for adaptive transmission of a codeword in a wireless communication system.

Still another embodiment provides a device and method for repeatedly transmitting a codeword when an error message is received from a reception device in a wireless communication system.

Still another embodiment provides a device and method for determining a repetition order for repeatedly transmitting a codeword in a wireless communication system.

Still another embodiment provides a device and method for determining a repetition order based on channel polarization in a wireless communication system.

Still another embodiment provides a device and method for determining a repetition turn based on channel quality information in a wireless communication system.

Still another embodiment provides a device and method for determining a repetition order through a bit-reversal calculation in a wireless communication system.

Still another embodiment provides a device and method for determining a repetition order based on a channel state in a wireless communication system.

An operation method of a transmission device in a wireless communication system according to various embodiments of the present disclosure includes: generating a codeword using a polar code; and transmitting a packet including at least one codeword indicated by a repetition order when bit repetition is needed, in which the repetition order is determined based on at least one of channel polarization and channel quality information.

An operation method of a reception device in a wireless communication system according to various embodiments of the present disclosure includes: receiving a packet including at least one bit indicated by a repetition order; and decoding the packet received based on the repetition order, in which the repetition order is determined based on at least one of channel polarization and channel quality information.

A transmission device in a wireless communication system according to various embodiments of the present disclosure includes: a communication unit configured to transmit or receive a signal; and a control unit configured to generate a codeword using a polar code, and control transmission of a packet including at least one codeword indicated by a repetition order when bit repetition is needed, in which the repetition order is determined based on at least one of channel polarization and channel quality information.

A reception device in a wireless communication system according to various embodiments of the present disclosure includes: a communication unit configured to receive a packet including at least one bit indicated by a repetition order; and a control unit configured to decode the packet based received on the repetition order, in which the repetition order is determined based on at least one of channel polarization and channel quality information.

A polar code designed based on puncturing and a repetition transmission pattern used when the polar code is designed based on repetition, after all punctured bits are retransmitted, can ensure excellent performance compared to a conventional technology through a method for determining the repetition transmission pattern to be used.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
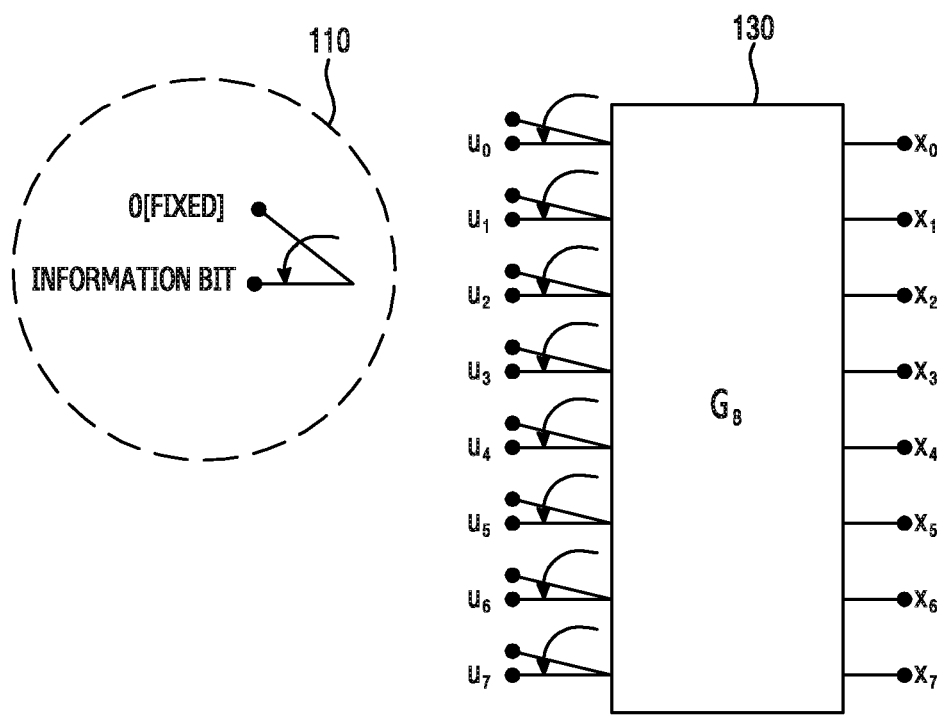
FIG. 1 illustrates a polar encoder for polar encoding according to the present disclosure.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, the operating principle of the present disclosure will be described in detail with reference to the accompanying drawings. In describing the present disclosure below, a detailed description of related known configurations or functions incorporated herein will be omitted when it is determined that the detailed description thereof may unnecessarily obscure the subject matter of the present disclosure. The terms which will be described below are terms defined in consideration of the functions in the present disclosure, and may be different according to users, intentions of the users, or customs. Therefore, the definitions of the terms should be made based on the contents throughout the specification.

Hereinafter, the present disclosure will describe a technique for transmitting a codeword in a wireless communication system.

Hereinafter, a term referring to control information, a term referring to a state change, a term referring to a change state of a bit stream according to encoding, terms referring to network entities, terms referring to messages, terms referring to elements of a device, etc., are provided as examples for convenience of description. Therefore, the present disclosure is not limited to the following terms, and other terms having the equivalent technical meanings may be used.

In the present disclosure, an adaptive transmission system is considered. A transmission device may use a polar code for message encoding. The adaptive transmission system considered in the present disclosure may include initial transmission and retransmission after the initial transmission. The retransmission may be performed when an error has occurred in previous transmission and a Negative ACKnowledge (NACK) message is thus received from a reception terminal. When the initial transmission is performed, the transmission device may perform transmission using a coding rate determined based on channel information. When the retransmission is performed at the later time, the transmission device may use a scheme in which a parity is additionally transmitted so as to increase a decoding success rate. A representative adaptive transmission system is a technology called a Hybrid Automatic Repeat-Request (HARQ). An embodiment of the present disclosure describes a method and device for transmitting a polar code based on a HARQ, but such a description should not be understood as a limitation of the embodiment. Therefore, the embodiment of the present disclosure may include all transmission systems which the technical idea of the present disclosure may affect.

The present disclosure deals with adaptive transmission of a codeword which is encoded using a polar code and, particularly, proposes an effective retransmission method in which a design feature of the polar code is considered.

Before describing operating principles of various embodiments, a general operating principle of a polar encoder is described. An input of a polar encoder may be defined as Ma having K+α bits, and an output may be defined as X having N bits. Necessary symbols for describing polar encoding are defined in TABLE 1 below.

TABLE I

| Sign | Meaning |
|---|---|
| $G_N$ | A polar code generator matrix having the size of N × N, in which $N = 2^n$. Defined as $G_N = B_N F^{\otimes n}$, in which BN is a bit-reversal matrix having the size of N × N proposed by Arikan, and $F = \begin{bmatrix} 1 & 0 \\ 1 & 1 \end{bmatrix}_{\otimes n}$ means n-th operation of Kronecker product. $G_N^{Non} = F^{\otimes n}$ can be also used as a generator matrix of a polar code. The meaning of BN matrix will be described using an example, hereinafter. In the present document, GN is mainly considered as a polar code generator matrix, and the proposed technology of the disclosure can be also applied when $G_N^{Non}$ is used as a generator matrix. |
| I | Information set of a polar code. A set having the size of K + α, which is a subset of {0, 1, 2, . . . , N − 1}. I is a set generated based on a channel polarization phenomenon, and a detailed description of a method for generating I is omitted. |
| $G_N$ (I) | A sub-generator matrix of a polar code, having the size of (K + α) × N. With respect to all i ∈ I, a sub-generator matrix having (i + 1)th rows in $G_N$ matrix. |
| U(I) | U is a row vector (U = $u_0, u_1, \ldots, u_{N-1}$) having the size of N × 1. U(I) is defined as U (I) = ($u_i$:i ∈ I), and is a sub-vector of U. The order of components within vector U(I) follows the order of components within vector U. |

All polar codes having the code length of N may be expressed as generator matrix $G_N(I)$. With respect to information set I having the size of K+α, polar encoding may be indicated as EQUATION 1. In this case, multiplication is performed by a binary operation.

$$M_\alpha \times G_N(I) = X \qquad \text{[EQUATION 1]}$$

In EQUATION 1, $M_\alpha$ is a row vector having the size of K+α, sub-generator matrix $G_N(I)$ has the size of (K+α)×N, and therefore X is a binary vector having the size of 1×N. The X is a codeword of a polar code and is modulated into a signal so as to pass through a channel.

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \qquad \text{[EQUATION 2]}$$

$$G_8^{Non} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

In EQUATION 2, $G_8$ is a polar code generator matrix having the size of 8×8, and $G_8^{Non}$ is a matrix generated through a bit-reversal of $G_8$.

Rearrangement of rows in a bit-reversal order is as follows. First, zero to seven are sequentially assigned, as indexes, to the first row to the last row of matrix $G_8^{Non}$. Since N=8, when each index is extended to a three-bit binary number, the outcome corresponds to (000), (001), (010), (011), (100), (101), (110), (111). When the order of the first and last bits of each index is reversed while maintaining the order of row indexes, the outcome corresponds to (000), (100), (010), (110), (001), (101), (011), (111). When these values extended to three-bit binary numbers are converted to integer values, the outcome corresponds to 0, 4, 2, 6, 1, 5, 3, 7. That is, matrix $G_8$ is generated by rearranging the rows of matrix $G_8^{Non}$ in 0, 4, 2, 6, 1, 5, 3, 7 row index order. In the same manner, matrix $G_8^{Non}$ is generated by rearranging the rows of matrix $G_8$ in the bit-reversal order.

As an embodiment of the present disclosure, $G_8$ is considered between the two matrices above. In matrix $G_8$, a sub-generator matrix $G_8(I)$ is determined according to the size and elements of set I. If K+α=4 and I={3, 5, 6, 7} in which I is an information set of a polar code, rows used to generate the sub-generator matrix $G_8(I)$ in matrix $G_8$ are rows corresponding to values generated by adding one to each element of I. That is, fourth, sixth, seventh, and eighth rows are used to constitute matrix $G_8(I)$, and matrix $G_8(I)$ has the size of 4×8 like EQUATION 3.

$$G_8(I) = \begin{bmatrix} 1 & 0 & 1 & 0 & 1 & 0 & 1 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \qquad \text{[EQUATION 3]}$$

In EQUATION 3, K+α information bits are polar encoded through matrix $G_8(I)$, and this process may be expressed like EQUATION 4 (information bits are expressed as bi).

$$(b_0 \ b_1 \ b_2 \ b_3) \times G_8(I) = (x_0 \ x_1 \ x_2 \ x_3 \ x_4 \ x_5 \ x_6 \ x_7) = \qquad \text{[EQUATION 4]}$$
$$(b_0+b_1+b_2+b_3 \ \ b_1+b_2+b_3 \ \ b_0+b_2+b_3 \ \ b_2+b_3 \ \ b_0+b_1+b_3 \ \ b_1+b_3 \ \ b_0+b_3 \ \ b_3)$$

FIG. 1 illustrates a polar encoder for a polar encoding process described above.

In FIG. 1, the block 130 on the right indicates a polar encoder using $G_8$. Reference numeral 110 in FIG. 1 expresses an enlarged view of a data input unit of the polar encoder. Eight elements of $U=(u_0, u_1, \ldots, u_7)$ are input from the left side of the polar encoder, and X which has been mentioned above corresponds to output. However, each element of U operates as a switch, and operates in a mode in which a fixed value is transmitted or in a mode in which an information bit is transmitted. FIG. 1 is a case where the fixed value is zero as expressed in reference numeral 110.

When I={3, 5, 6, 7} like an example described above, an electronic device always inputs a fixed value of zero through $U(I^c)=(u_0, u_1, u_2, u_4)$ and transmits an information bit through remaining positions of $U(I)=(u_3, u_5, u_6, u_7)$. Four information bits have one-to-one mapping relationship with $u_3, u_5, u_6, u_7$ bits.

A transmission device may use a block coding technique in an encoding process using a polar code. Therefore, when a polar code for initial transmission is designed, the transmission device may design a codeword based on puncturing or repetition and perform transmission. The present disclosure proposes a scheme for determining an optimal repetition transmission pattern used for a repetition-based design and a repetition transmission pattern used after the polar code designed based on puncturing has retransmitted all the punctured bits according to a retransmission request of a reception side.

Figure 2:
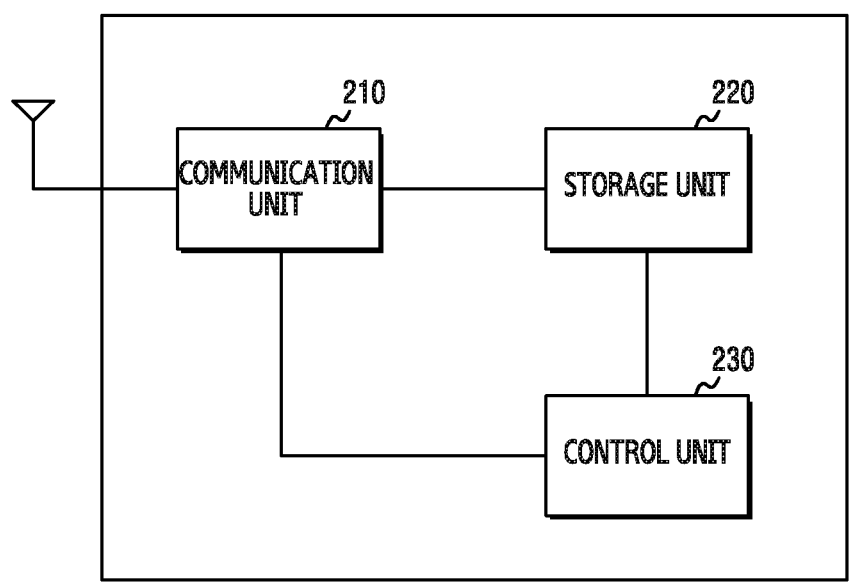
FIG. 2 illustrates a transmission device according to the present disclosure.

FIG. 2 illustrates a transmission device according to the present disclosure. The terms including "- unit" and "- device" which will be used below mean a unit which processes at least one function or operation, and may be implemented by hardware, software, or a combination of hardware and software. Referring to FIG. 2, the transmission device includes a communication unit 210, a storage unit 220, and a control unit 230.

The communication unit 210 performs functions for transmitting or receiving a signal through a wireless channel. For example, the communication unit 210 performs a function of conversion between a baseband signal and a bit stream according to a physical layer standard of the system. For example, when data is transmitted, the communication unit 210 generates complex symbols by encoding and modulating a transmission bit stream. Also, when data is received, the communication unit 210 reconstructs a reception bit stream by demodulating and decoding a baseband signal. Also, the communication unit 210 performs an uplink conversion of a baseband signal to a radio frequency (RF) band signal and then transmits the same through an antenna, and performs a downlink conversion of the RF band signal received through the antenna to a baseband signal. For example, the communication unit 210 may include a transmission filter, a reception filter, an amplifier, a mixer, an oscillator, a Digital to Analog Convertor (DAC), an Analog to Digital Convertor (ADC), and so on.

Also, the communication unit 210 may include a plurality of RF chains. Further, the communication unit 210 may perform beamforming. For beamforming, the communication unit 210 may adjust the size and phase of each of signals transmitted or received through a plurality of antennas or antenna elements. Further, the communication unit 210 may include a plurality of communication modules in order to support a plurality of wireless access technologies which are different from each other.

Also, the communication unit 210 may include different communication modules in order to process signals in different frequency bands. For example, different communication standards may include Bluetooth Low Energy (BLE), Wi-Fi Gigabyte (WiGig), a cellular network (e.g., Long Term Evolution (LTE)), and so on. Also, different frequency bands may include a Super High Frequency (SHF) (e.g., 2.5 GHz and 5 Ghz) and a millimeter wave (e.g., 60 GHz).

The communication unit 210 transmits and receives a signal as described above. Accordingly, the communication unit 210 may be referred to as a transmission unit, a reception unit, or a transmission or reception unit. Also, in description hereinafter, the meaning of transmission and reception performed through a wireless channel includes performing a process by the communication unit 210 in the same manner as described above.

The storage unit 220 stores data such as a basic program, an application program, and configuration information, for an operation of the transmission device. The storage unit 220 may include a volatile memory, a non-volatile memory, or a combination of a volatile memory and a non-volatile memory. Particularly, the storage unit 220 may store an interleaving address for determining a transmission order of a polar code according to an embodiment of the present disclosure. Specifically, the storage unit 220 may store an interleaving address for puncturing-based transmission when the polar code is designed based on puncturing, and an interleaving address for transmitting a repeated bit after all punctured bits have been transmitted. Alternatively, the storage unit 220 may store an interleaving address for repetition-based transmission when the polar code is designed based on repetition. In addition, the storage unit 220 provides stored data according to a request of the control unit 230.

The control unit 230 controls overall operations of the transmission device. For example, the control unit 230 transmits or receives a signal through the communication unit 210. Also, the control unit 230 records data in the storage unit 220 and reads the same. To this end, the control unit 230 may include at least one processor or a microprocessor, or may be a part of a processor. Also, a part of the communication unit 210 and the control unit 230 may be referred to as a Communication Processor (CP). Particularly, the control unit 230 controls the transmission device to generate an interleaving address according to various embodiments which will be described hereinafter. Alternatively, the control unit 230 may determine a repetition order based on a structured algorithm. According to the present disclosure, a repetition order may be referred to as a repetition transmission order, a repetition pattern or repetition transmission order, and so on. For example, the control unit 230 may control the transmission device to perform processes illustrated in FIGS. 5 to 10 below.

The transmission device according to the present disclosure includes all devices which transmit a codeword using an adaptive transmission method. For example, the transmission device may include a smart phone, a computer, a cellular phone, a user equipment, a mobile station (MS), or a multimedia device capable of performing a communication function.

In some embodiments, the device of FIG. 2 may also operate as a reception device.

Figure 3:
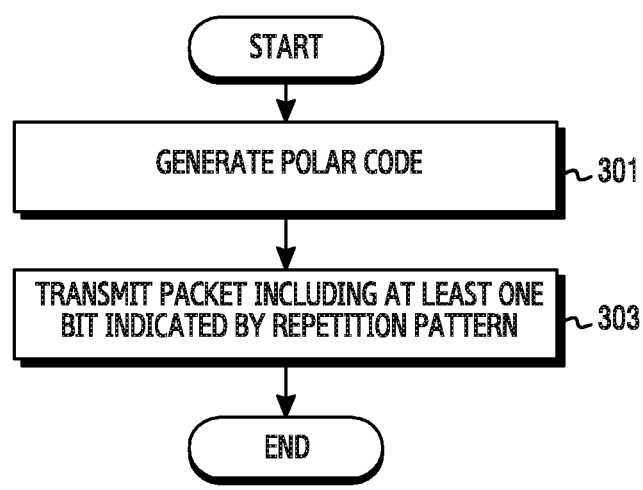
FIG. 3 illustrates a flow diagram indicating an operation method of a transmission device for adaptive transmission of a polar code according to the present disclosure.

FIG. 3 illustrates a flow diagram indicating an operation method of a transmission device for adaptive transmission of a polar code according to the present disclosure.

Referring to FIG. 3, the transmission device generates a polar code, in step 301. Specifically, the transmission device may generate polar code X having N bits through a polar coder, using input $M_\alpha$ having K+α bits. For example, the transmission device may generate polar code X through the polar encoder presented through FIG. 1. In a situation where K+α bits are encoded into $N_1$ bits and transmitted when $N_1$ is smaller than N, the transmission device may determine a codeword based on puncturing. Alternatively, in a situation where K+α bits are encoded into $N_1$ bits and transmitted when $N_1$ is greater than N, the transmission device may determine a codeword based on repetition.

In step 303, the transmission device transmits a packet including at least one bit indicated by a repetition order. Specifically, when a codeword is designed based on repetition and transmitted, the transmission device may transmit a packet including at least one bit indicated by a repetition order. Alternatively, when a codeword is designed based on puncturing and transmitted, the transmission device may transmit a packet including at least one bit indicated by a repetition order in a retransmission process according to an error report of a reception side. The transmission device may determine the repetition order based on at least one of a channel polarization principle, channel quality information, and a bit-reversal calculation. The transmission device may store the repetition order through a scheme for addressing the same in a memory. For example, the transmission device may store, in a memory, the repetition order determined based on a channel polarization principle. Alternatively, the transmission device may store, in a memory, the repetition order determined based on channel quality information. Alternatively, the transmission device may store, in a memory, the repetition order determined based on a bit-reversal calculation. When a codeword is required to be repeatedly transmitted, the transmission device may determine a repetition order using the repetition order stored in the memory.

Although not illustrated in FIG. 3, the transmission device may transmit a message including information on the repetition order of the polar code to a reception device. For example, a repetition order may be transmitted as a part of resource allocation information, feedback information, or system information.

Figure 4:
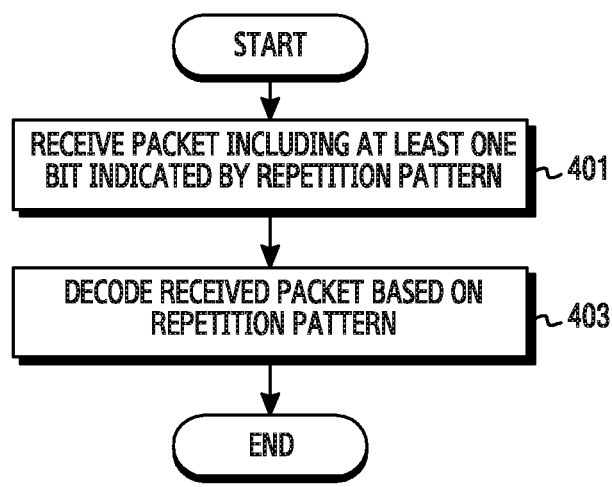
FIG. 4 illustrates a flow diagram indicating an operation method of a reception device for receiving a polar code according to the present disclosure.

FIG. 4 illustrates a flow diagram indicating an operation method of a reception device for receiving a polar code according to the present disclosure.

Referring to FIG. 4, a reception device may receive a packet including at least one bit indicated by a repetition order, in step 401. Specifically, when a codeword is designed based on repetition and transmitted, the reception device may receive a packet including at least one bit indicated by a repetition order. Alternatively, when a codeword is designed based on puncturing and transmitted, the reception device may receive a packet including at least one bit indicated by a repetition order in a retransmission process according to an error report. The repetition order may be determined, by a transmission device, based on at least one of a channel polarization principle, channel quality information, and a bit-reversal calculation. The transmission device may receive a message including information on the repetition order from the reception device.

In step 403, the reception device decodes the packet received based on the repetition order. Specifically, the reception device may decode the packet received based on information on the repetition order transmitted from the transmission device. That is, according to an embodiment, the reception device may decode the packet after receiving the message including information on the repetition order from the transmission device. According to another embodiment, a repetition order may be predefined. In this case, the repetition order may not be received from the transmission device. Although not illustrated in FIG. 4, the reception device may request retransmission of a codeword from the transmission device when decoding of a normally received packet fails.

Figure 5A:
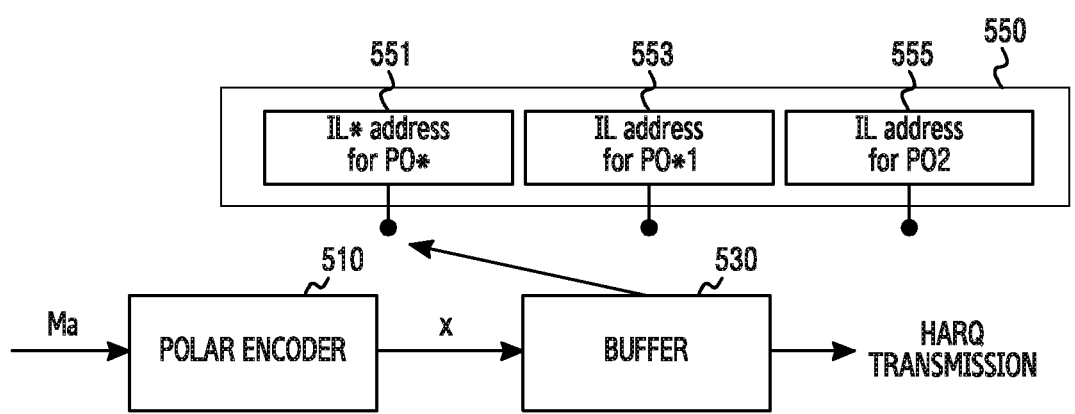
FIGS. 5A to 5C illustrate block diagrams for adaptive transmission of a polar code according to the present disclosure.
Figure 5B:
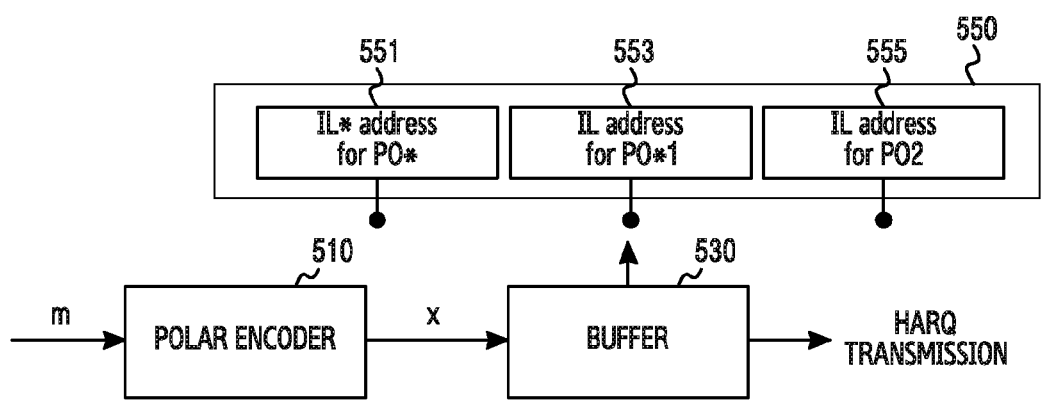
Figure 5C:
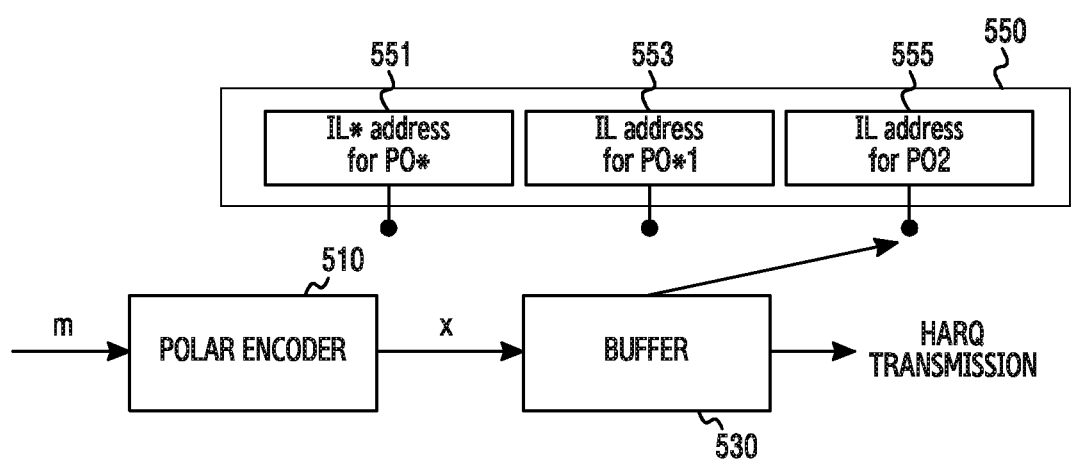

FIGS. 5A to 5C illustrate block diagrams for adaptive transmission of a polar code according to the present disclosure. According to an embodiment, FIG. 5 indicates a method for adaptively transmitting a polar code, which is designed based on repetition or puncturing, on the basis of a puncturing order (PO) or a repetition order (RO) which are stored in an interleaving address storage unit. Although not illustrated in FIG. 5, the interleaving address storage unit, which is not displayed through a drawing, may be included in a part of a memory.

The transmission device may determine a repetition order based on at least one of a channel polarization principle, channel quality information, and a bit-reversal calculation. The transmission device may store the determined repetition order in the interleaving address storage unit.

Specifically, FIGS. 5A and 5B illustrate block diagrams for adaptive transmission when N is greater than $N_1$ in a transmission system. That is, a transmission method, in a situation where K+α bits are encoded into $N_1$ bits and transmitted when $N_1$ is smaller than N, is indicated. FIG. 5A indicates a first transmission method and FIG. 5B indicates a transmission method in which second transmission, third transmission, etc. are included, except for first transmission.

Referring to FIG. 5A, the transmission device may generate polar code X via a polar encoding process of message $M_\alpha$, using a polar encoder 510. According to an embodiment, message $M_\alpha$ may be a row vector having the size of K+α, and polar code X may have the length of N. Here, the length of N of polar code "X" may be $2^n$ (n is a positive integer). Therefore, the transmission device may use a puncturing technique or a repetition technique in order to design a polar code which supports various lengths. The transmission device may temporarily store codeword X in a buffer 530 for adaptive transmission. That is, the transmission device may temporarily store codeword X in the buffer 530 for transmission based on the puncturing order or the repetition order.

As described above, when N is greater than $N_1$, the transmission device may use polar code X designed based on puncturing. The transmission device may rearrange codeword X temporarily stored in the buffer 530 in order to randomly disperse bit error occurrences. According to an embodiment of the present disclosure, the transmission device may transmit codeword X temporarily stored in the buffer 530 based on an interleaving address stored in the interleaving address storage unit 550. When N is greater than $N_1$, polar code X may be designed to be transmitted based on puncturing, and the transmission device may transmit codeword X based on an interleaving address 551 for the puncturing order according to the present disclosure. In other words, the transmission device may transmit bits located at address values indicated by an interleaving address 551. Therefore, when a polar code punctured at initial transmission is transmitted and all punctured bits are transmitted according to a retransmission request, the transmission device may transmit codeword X based on the interleaving address 551 for the puncturing order. That is, the transmission device may transmit $N_1$ bit transmitted at first transmission and N–$N_1$ bits transmitted at second transmission according to the retransmission request, based on the interleaving address 551 for the puncturing order. Here, the $N-N_1$ bits transmitted at the second transmission may include bits punctured at the first transmission.

However, the puncturing order, in general, may not provide a repetition order optimized for repetition transmission. Therefore, according to an embodiment of the present disclosure, the transmission device may not use the puncturing order, as it stands, for repetition transmission performed after all punctured bits are transmitted, but determine a repetition order so as to perform repetition transmission according thereto. Specifically, the transmission device may perform repetition transmission based on repetition order one. Repetition order one may provide a repetition order of a polar code designed based on puncturing. The transmission device may determine repetition order one based on at least one of a channel polarization principle, channel quality information, and a bit-reversal calculation.

FIG. 5B illustrates a method for performing repetition transmission based on an interleaving address 553 for repetition order one when the transmission device performs repetition transmission after transmitting all punctured bits in a case where N is greater than $N_1$. After all punctured bits have been transmitted, the transmission device may transmit codeword X stored in the buffer based on the interleaving address 553 for repetition order one in order to perform repetition transmission. For example, when an error has occurred at first transmission, that is, when an NACK message has been received from the reception device, the transmission device may perform a second transmission operation. The transmission device may preferentially include, at second transmission, bits punctured at first transmission according to the puncturing order and may repeatedly transmit remaining bits for satisfying transmission bit $N_1$ according to repetition order one. Alternatively, when an error has occurred at second transmission, the transmission device may perform repetition transmission based on repetition order one for third transmission.

Contrarily, FIG. 5C illustrates a block diagram for adaptive transmission when N is smaller than $N_1$ in a transmission system. That is, FIG. 5C indicates a transmission method when $N_1$ is greater than N in a situation where K+α bits are encoded into $N_1$ bits and transmitted. FIG. 5C includes all transmission operations such as a first transmission operation, a second transmission operation, and so on.

Referring to FIG. 5C, the transmission device may generate codeword X via a polar encoding process of message $M_\alpha$, using the polar encoder 510. According to an embodiment, message $M_\alpha$ may be a row vector having the size of K+α, and codeword X may have the length of N. The transmission device may temporarily store polar code X in the buffer 530 for adaptive transmission. That is, the transmission device may temporarily store codeword X in the buffer 530 in order to guarantee an optimal transmission order based on a puncturing order or a repetition order.

As described above, when N is smaller than $N_1$, that is, when the transmission device should perform initial transmission using a lower coding rate than a code rate which a system supports, the transmission device may design polar code X based on repetition and transmit the same. The transmission device may rearrange codeword X temporarily stored in the buffer 530 in order to randomly disperse bit error occurrences. According to an embodiment of the present disclosure, the transmission device may transmit codeword X temporarily stored in the buffer based on an interleaving address stored in the interleaving address storage unit 550. When N is smaller than $N_1$, X is designed based on repetition. Therefore, the transmission device may transmit codeword X based on an interleaving address 555 for repetition order two according to an embodiment of the present disclosure. The repetition order two may be combined with a repetition-based polar code design so as to provide an optimal repetition order. Therefore, the transmission device may perform first transmission based on R0#1. That is, the transmission device may transmit N bits transmitted at the first transmission and repeated $N-N_1$ bits, according to repetition order two. Since all retransmissions such as second transmission and third transmission are for repetition transmission, when an error has occurred at the first transmission, the transmission device may perform retransmission based on repetition order two. The transmission device may determine repetition order two based on at least one of a channel polarization principle, channel quality information, and a bit-reversal calculation.

Figure 6A:
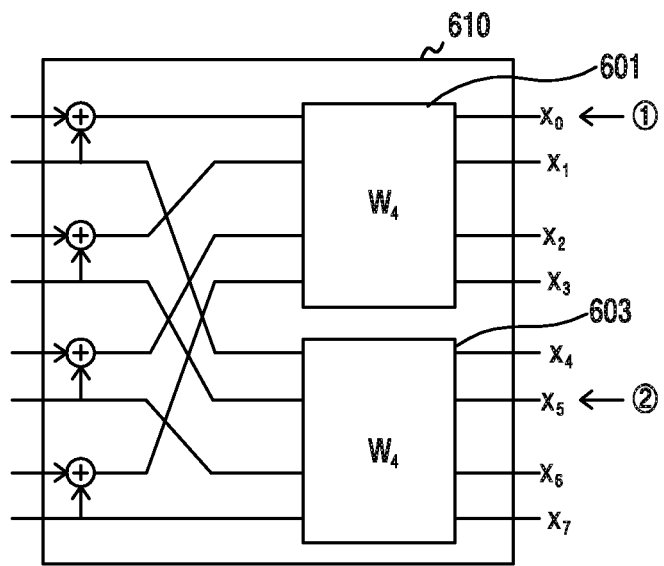
FIGS. 6A and 6B illustrate a design rule of a repetition order for adaptive transmission according to the present disclosure.
Figure 6B:
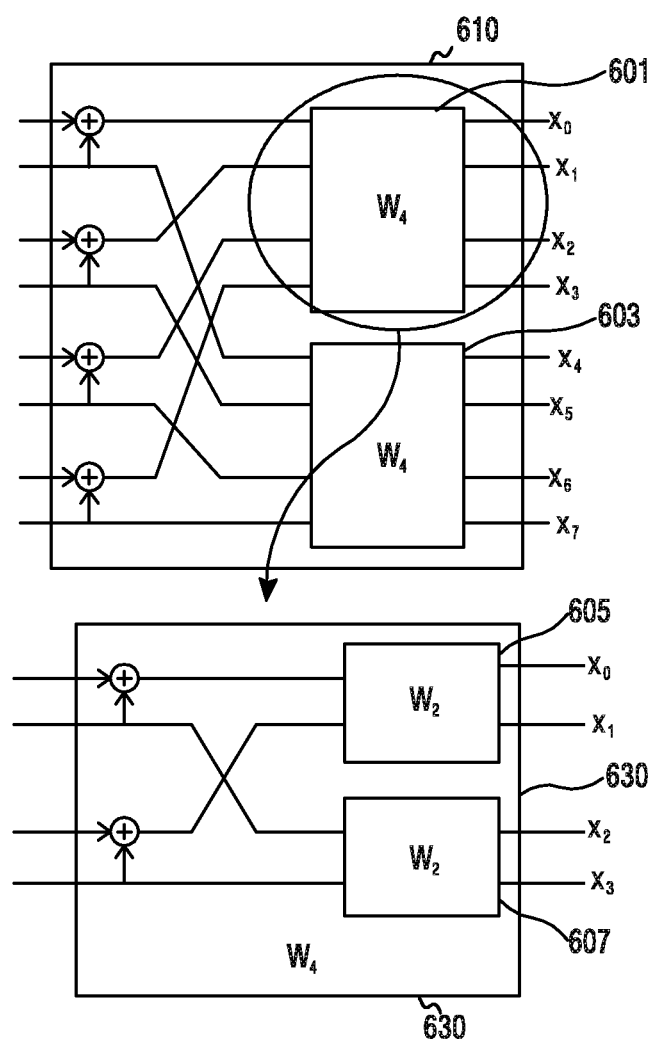

FIGS. 6A and 6B illustrate a design rule of a repetition order for adaptive transmission according to the present disclosure. FIG. 6 provides a method for designing a repetition order using channel polarization according to an embodiment. The transmission device may use channel polarization which is a technique for synthesizing and separating channels having the same capacity for polar coding. An embodiment based on the channel polarization principle provides a method for determining a repetition order such that the capacities of the synthesized channels $(W_2, W_4, \ldots W_N)$ are uniform.

In FIGS. 6A and 6B, reference numeral 610 indicates a polar encoder structure for $N=8(=2^3)$ for the purpose of explanation, not limitation of the embodiment. Therefore, the embodiment of the present disclosure corresponds to $N=2^n$ and includes a polar encoder where the value of n is any integer.

FIG. 6A illustrates a method for determining a repetition order when the number of repetition bits is two bits. Referring to FIG. 6A, the transmission device may generate polar code $X=\{x_0, x_1, x_2, x_3, \ldots, x_7\}$ through a polar encoder 610. According to an embodiment, it may be assumed that the transmission device determines polar code X based on repetition and transmits the same. That is, the embodiment indicates a transmission method when $N_1$ is greater than N in a situation where K+α bits are encoded into $N_1$ bits and transmitted. For example, when N is eight and $N_1$ is 10, the transmission device may repeatedly transmit $N_1-N=2$ bits at first transmission. In this case, the transmission device may determine a repetition order using channel polarization. For example, it may be assumed that one bit of $x_0$ to be transmitted through a first $W_4$ channel 601 is firstly repeated in a first transmission operation. In this case, the transmission device may secondly repeat, at the first transmission, one bit of $x_5$ to be transmitted through a second $W_4$ channel 603 for maintaining channel capacities uniform according to channel polarization. As a result, the transmission device may repeat two bits of $x_0$ and $x_5$ in the first transmission operation. The important point here is that the channel capacities are maintained uniform according to the channel polarization principle. Therefore, changing the repetition order of $x_0$ and $x_5$ is of no consequence as long as $x_5$ comes first and $x_0$ comes second. In addition, repetition of $x_0$ and $x_5$ is merely a simple example, and the transmission device may be able to perform repetition through a random combination for making channel capacities uniform in the first $W_4$ channel 601 and the second $W_4$ channel 603.

According to another embodiment, it may be assumed that the transmission device has designed polar code X based on puncturing. That is, the embodiment indicates a transmission method when $N_1$ is smaller than N in a situation where K+α bits are encoded into $N_1$ bits and transmitted. In this case, the transmission device may transmit $N_1$ bits and puncture $N-N_1$ bits, in a first transmission operation. When a second transmission operation is requested according to a retransmission request of the reception device, the transmission device may preferentially include, in the second transmission operation, the $N-N_1$ bits punctured in the first transmission operation according to the puncturing order. Also, the transmission device may repeat $N_1-(N-N_1)=2*N_1-N$ bits using channel polarization, using the same method as that described above, so that $N_1$ bits are finally transmitted in the second transmission operation. However, in the second transmission operation, a coding rate may be changed according to a channel state and $N_1$ bits and other random bits may be transmitted as a result. In this case, the number of repeated bits using channel polarization may be changed. In embodiments hereinafter, it is assumed that all transmissions (i.e., initial transmission and all retransmissions) are performed using $N_1$ bits for the purpose of explanation. However, such an assumption does not exclude an embodiment in which data is transmitted using sizes other than $N_1$ bits.

FIG. 6B illustrates a method for designing a repetition order when the number of repetition bits is four bits.

Referring to 6B, the transmission device may generate polar code $X=\{x_0, x_1, x_2, x_3, \ldots x_7\}$ using the polar encoder 610. According to an embodiment, it may be assumed that the transmission device has designed polar code X based on repetition. That is, the embodiment indicates a transmission method when $N_1$ is greater than N in a situation where $K+\alpha$ bits are encoded into $N_1$ bits and transmitted. For example, when N is eight and $N_1$ is 12, the transmission device may repeatedly transmit $N_1-N=4$ bits in a first transmission operation. In this case, the transmission device may use the channel polarization principle in order to design a repetition order. For example, it may be assumed that one bit of $x_0$ to be transmitted through a first $W_4$ channel 601 is firstly repeated at first transmission. In this case, the transmission device may secondly repeat, at the first transmission, one bit of $x_5$ to be transmitted through a second $W_4$ channel 603 for maintaining channel capacities uniform according to channel polarization. In addition, it may be assumed that one bit of $x_2$ to be transmitted through the first $W_4$ channel 601 is thirdly repeated at the first transmission. In this case, the transmission device may fourthly repeat, at the first transmission, one bit of $x_6$ to be transmitted through the second $W_4$ channel 603 for maintaining channel capacities uniform. Reference numeral 630 indicates a specified form of the first $W_4$ channel 601. The first $W_4$ channel 601 may include a first $W_2$ channel 605 and a second $W_2$ channel 607. Although not illustrated in a drawing, the second $W_4$ channel 603 includes two $W_2$ channels like the first $W_4$ channel 601. The channel polarization principle may also be applied between the first $W_2$ channel 605 and the second $W_2$ channel 607. Therefore, the transmission device may determine a repetition order using a method by which the capacities among $W_2$ channels are uniform. As a result, the transmission device may repeat four bits of $x_0$, $x_2$, $x_5$, and $x_6$ in the first transmission operation. The important point here is that the channel capacities are maintained uniform according to the channel polarization principle. Therefore, changing the repetition order of $x_0$, $x_2$, $x_5$, and $x_6$ is of no consequence. Also, the repetition of $x_0$, $x_2$, $x_5$, and $x_6$ is merely a simple example, and the transmission device may be able to perform repetition through a random combination for making the channel capacities between the first $W_4$ channel 601 and the second $W_4$ channel 603 uniform. In addition, the transmission device may be able to perform repetition through a random combination for making the channel capacities of the first $W_2$ channel 605 and the second $W_2$ channel 607 uniform.

According to another embodiment, it may be assumed that the transmission device has designed polar code X based on puncturing. That is, the embodiment indicates a transmission method when $N_1$ is smaller than N in a situation where $K+\alpha$ bits are encoded into $N_1$ bits and transmitted. In this case, the transmission device may transmit $N_1$ bits and puncture $N-N_1$ bits, in a first transmission operation. When a second transmission operation is performed according to a retransmission request, the transmission device may preferentially transmit, in the second transmission operation, the $N-N_1$ bits punctured in the first transmission operation according to the puncturing order. Also, the transmission device may repeat $N_1-(N-N_1)=2*N_1-N$ bits using channel polarization, using the same method as that described above, so that $N_1$ bits are finally transmitted in the second transmission operation.

Through the method presented in FIG. 6, a repetition order of random K bits may be determined. That is, not only the repetition order of two bits and four bits but also the repetition order of random K bits may be determined by applying channel polarization.

Figure 7:
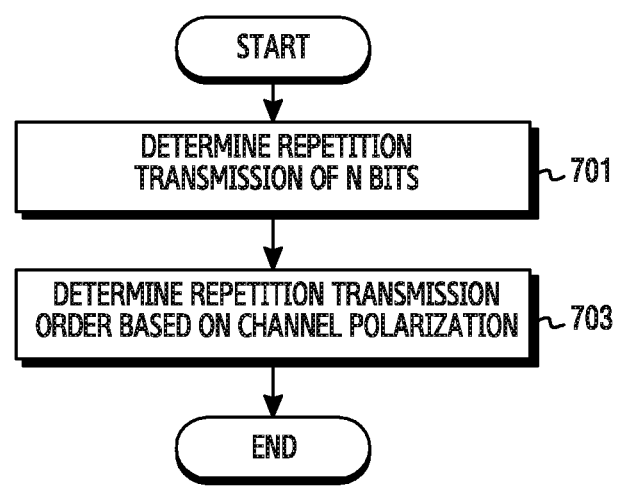
FIG. 7 illustrates a flow diagram indicating a method for determining a repetition order based on channel polarization according to the present disclosure.

FIG. 7 illustrates a flow diagram indicating a method for determining a repetition order based on channel polarization according to the present disclosure.

Referring to FIG. 7, the transmission device may determine repetition transmission of N bits, in step 701, where N may be any integer greater than zero presented for the purpose of explanation, not limitation of the embodiment. It may be assumed that the transmission device is required to repeatedly transmit N bits according to a situation when polar code X is designed based on repetition or puncturing and transmitted. For example, it may be assumed that codeword X is designed based on puncturing and transmitted. That is, a transmission method, when $N_1$ is smaller than N in a situation where $K+\alpha$ bits are encoded into $N_1$ bits and transmitted, is indicated. When an error message has been received from the reception device, the transmission device may preferentially transmit bits punctured in a previous transmission operation, and then repeatedly transmit remaining N bits. For another example, it may be assumed that codeword X is designed based on repetition and transmitted. That is, a transmission method, when $N_1$ is greater than N in a situation where $K+\alpha$ bits are encoded into $N_1$ bits and transmitted, is indicated. In this case, the transmission device may determine repetition transmission of N bits.

In step 703, the transmission device may determine a repetition order of N bits based on a channel polarization principle. Specifically, the technical feature may use a structured algorithm through the channel polarization principle in order to determine a repetition order of N bits required to be repeatedly transmitted. The transmission device may use channel polarization which is a technique for synthesizing and separating channels having the same capacity for polar coding. The transmission device may determine the repetition order based on the channel polarization principle such that the capacities of the synthesized channels ($W_2$, $W_4$, . . . , $W_N$) are uniform. Description through specific embodiments are presented through FIGS. 6A and 6B.

A specific process for designing a repetition pattern like FIGS. 6A and 6B according to the polarization principle may be variously defined. For example, a repetition pattern may be designed by bit-reversal like FIGS. 8A and 8B below.

Figure 8A:
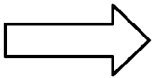
FIGS. 8A and 8B illustrate a specific design method for a repetition order according to the present disclosure.
Figure 8B:

FIGS. 8A and 8B illustrate a specific design method for a repetition order according to the present disclosure. FIGS.

8A and 8B provide a method for determining, by the transmission device, a repetition order through a structured algorithm.

Referring to the table on the left in FIGS. 8A and 8B, $x_1$ indicates a polar code generated through a polar encoder of $N=8(=2^3)$, in reference numeral 810. However, the technical idea of the present disclosure is not limited to the polar encoder of $N=8(=2^3)$, and may include a polar encoder of random $N=2^n$. Codeword index i of polar code $x_i$ generated through the polar encoder of $N=8(=2^3)$ includes indexes of zero to seven. That is, the transmission device may generate codeword $X=\{x_0, x_1, x_2, x_3, \ldots, x_7\}$ through a polar encoding process. Codeword index i may be expressed like reference numeral 830 when the same is extended to a three-bit binary number. That is, i may be expressed as $\{000\}$ when i is zero, i may be expressed as $\{001\}$ when i is one, . . . , and i may be expressed as $\{111\}$ when i is seven.

Referring to the table on the right in FIGS. 8A and 8B, codeword index i extended to a three-bit binary number indicates the result of a bit-reversal calculation performed by the transmission device. Specifically, reference numeral 850 indicates the result of the bit-reversal calculation in reference numeral 830, and reference numeral 870 indicates a codeword for repetition corresponding to the result of the bit-reversal calculation. For example, codeword index three of codeword $x_3$ in reference numeral 810 becomes $\{011\}$ when the same is extended to a three-bit binary number. When a bit-reversal calculation is performed for $\{011\}$, $\{011\}$ becomes $\{110\}$ in reference numeral 850. $\{110\}$ becomes six when re-expressed in a decimal number, and indicates a repetition order of codeword $x_6$.

According to the order of reference numeral 870, the transmission device may determine a repetition order like the order of $\{x_0, x_4, x_2, x_6, x_1, x_5, x_3, x_7\}$. The repetition order of reference numeral 870 may be referred to as a bit-reversal transmission order. The bit-reversal transmission order satisfies the channel polarization principle described in FIG. 5. That is, when the number of repetition bits is two, the transmission device may firstly repeat $x_0$ and secondly repeat $x_4$, according to the bit-reversal transmission order. Accordingly, the capacity of synthesized channel $W_4$ may be uniform. Alternatively, when the number of repetition bits is four, the transmission device may firstly repeat $x_0$ and secondly repeat $x_4$, according to the bit-reversal transmission order. In addition, the transmission device may thirdly repeat $x_2$ and may fourthly repeat $x_6$. As a result, the capacities of channels among synthesized channel $W_4$ may be uniform. Also, the capacities among synthesized channel $W_2$ may be uniform. The method for determining a repetition order presented through FIGS. 8A and 8B is an embodiment according to the technical idea of the present disclosure. Therefore, other embodiments are neither limited nor excluded thereby.

Figure 9:
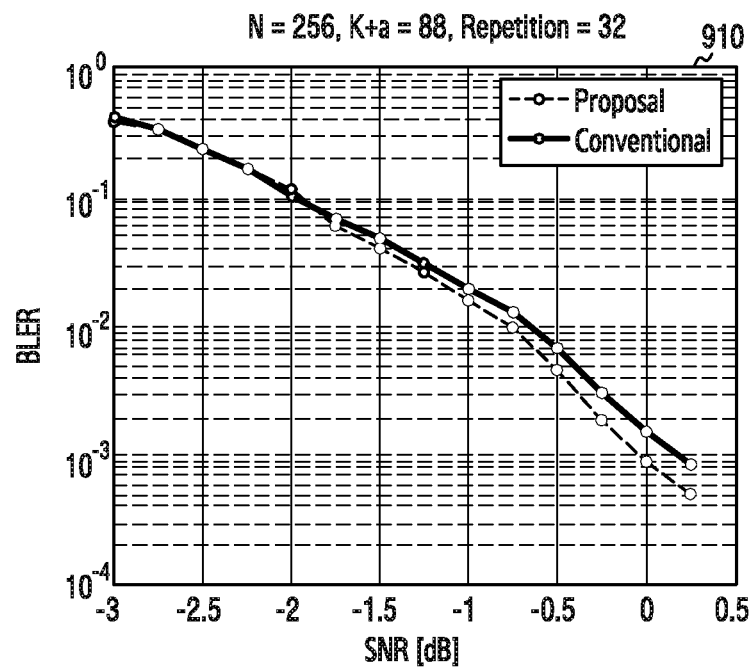
FIG. 9 illustrates a result of repetition transmission based on a bit-reversal transmission order according to the present disclosure.
Figure 9:
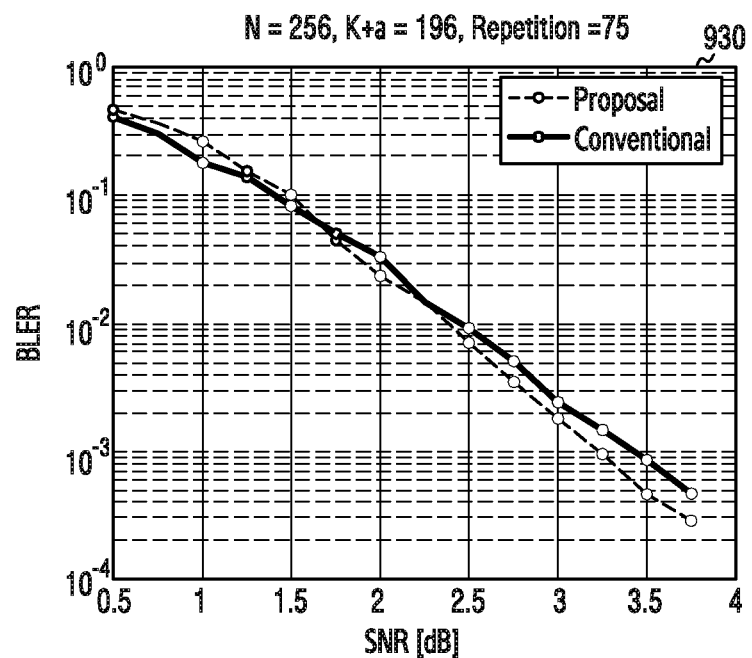

FIG. 9 illustrates a result of repetition transmission based on a bit-reversal transmission order according to the present disclosure. Specifically, FIG. 9 is a graph through which the effect of a conventional repetition transmission technique and the effect of a repetition transmission technique of the bit-reversal transmission order presented through FIGS. 8A and 8B are compared.

In reference numeral 910 of FIG. 9, the effect of a conventional repetition transmission technique and the effect of the repetition transmission technique of the bit-reversal transmission order are compared in a condition where $\{N=256, K+\alpha=88,$ and repetition bit=32$\}$. In reference numeral 930 of FIG. 9, the effect of a conventional repetition transmission technique and the effect of the rep-etition transmission technique of the bit-reversal transmission order are compared in a condition where $\{N=256, K+\alpha=196,$ and repetition bit=75$\}$. Referring to FIG. 9, it may be seen that the proposed technique indicates a performance gain of approximately 0.3 dB in a continuous removal decoding environment.

Unlike the method of determining a repetition order by using channel polarization and a bit-reversal calculation as described above, FIGS. 10 and 11 present a method for determining a repetition order based on channel quality information.

Figure 10:
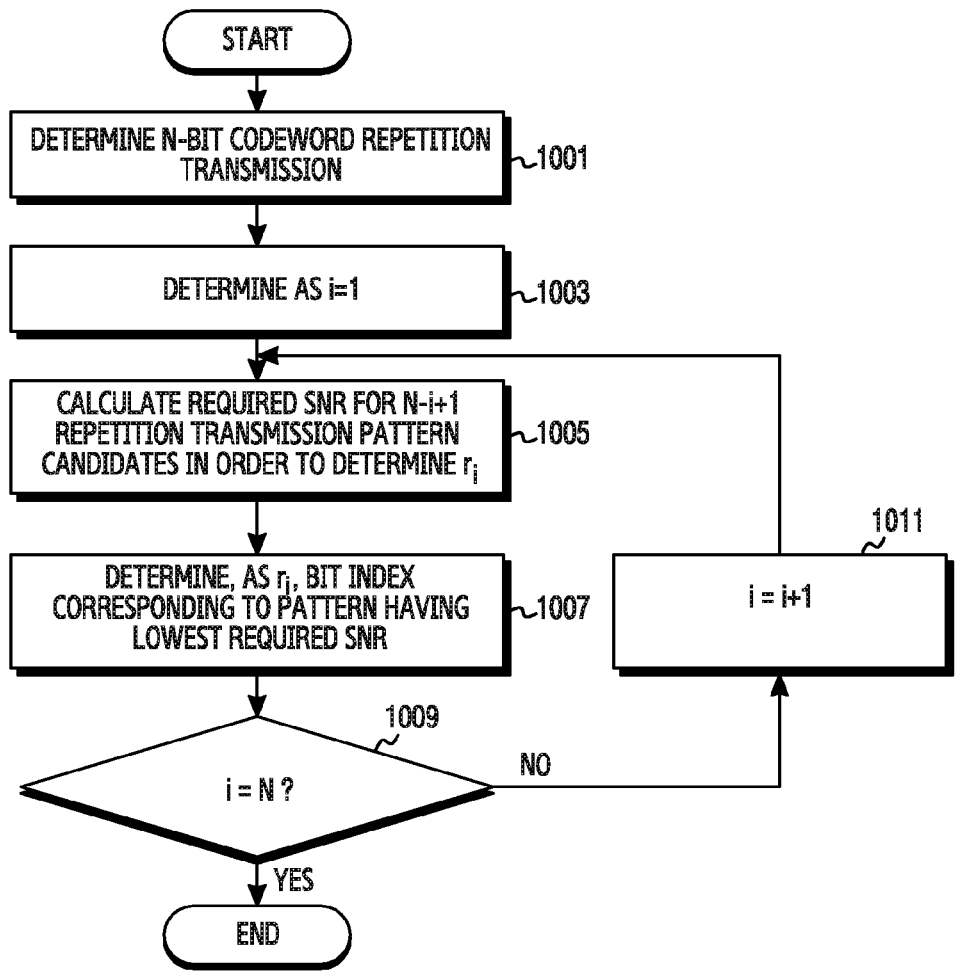
FIG. 10 illustrates a flow diagram for determining a repetition order based on channel quality information according to the present disclosure.

FIG. 10 illustrates a flow diagram for determining a repetition order based on channel quality information according to the present disclosure, where the channel quality information includes a signal-to-noise ratio (SNR), a carrier to interference plus noise ratio (CINR), and so on.

Referring to FIG. 10, the transmission device may determine repetition transmission of an N-bit codeword, in step 1001. A repetition order (RO) for the N-bit codeword may be indicated as $\{r_1, r_2, r_3, \ldots, r_N\}$, where N is any integer greater than zero presented for the purpose of explanation, not limitation of the embodiment. The transmission device may generate codeword X of N bits via a polar encoding process. When codeword X is designed based on repetition or puncturing and transmitted, it may be assumed that repetition transmission of N bits is required. For example, it may be assumed that the transmission device designs codeword X based on puncturing and transmits the same. The transmission device may preferentially include a bit punctured in a previous transmission operation, and may determine repetition transmission of the N-bit codeword when an error message has been received from the reception device. For another example, it may be assumed that codeword X is designed based on repetition and transmitted. In this case, the transmission device may determine repetition transmission of the N-bit codeword.

The transmission device may determine that i=1, in step 1003, where i is any integer equal to or greater than one and may be gradually increased by one. i=1 indicates a one-bit codeword for first repetition transmission.

The transmission device may determine channel quality for (N−i+1) repetition transmission pattern candidate groups in order to determine $r_1$, in step 1005. For example, the transmission device may determine a required SNR for the (N−i+1) repetition transmission pattern candidate groups. For example, when i=1, the transmission device may determine a required SNR for (N−1+1)=N repetition transmission pattern candidate groups in order to determine $r_1$. That is, the transmission device may determine the required SNR for all the N repetition transmission pattern groups in order to determine codeword index $r_1$ to be firstly repeated. Here, the required SNR may be determined using an absolute value of a difference between an approximated block error rate (BLER) and a target error rate. A method for determining a required SNR is described in detail through a flow diagram in FIG. 11.

The transmission device may determine, as $r_1$, a bit index corresponding to a pattern having optimal channel quality, in step 1007. For example, the transmission device may determine, as $r_1$, a bit index corresponding to a pattern having a lowest required SNR. For example, when i=1, the transmission device may determine, as $r_1$, a bit index corresponding to a pattern having a lowest required SNR among the N repetition transmission pattern groups in order to determine bit index $r_1$.

The transmission device may determine whether i=N is satisfied, in step 1009. When i=N is satisfied, it means that the repetition order is all determined so that the transmission device may terminate an operation. Contrarily, when i=N is not satisfied, that is, when i is smaller than N, the transmission device moves to step 1011.

In step 1011, the transmission device may perform i=i+1 calculation. The transmission device may perform a calculation of adding one to i in order to sequentially determine $r_1, r_2, \ldots, r_n$, in step 1011. For example, when $r_1$ has been determined, the transmission device may perform a calculation of adding one to i in order to determine $r_2$.

Later, the transmission device may move back to step 1005 and circularly repeat steps 1005 to 1011. The transmission device may make a final determination of a repetition order=$(r_1, r_2, r_3, r_N)$ through the circular repetition of steps 1005 to 1011.

Figure 11:
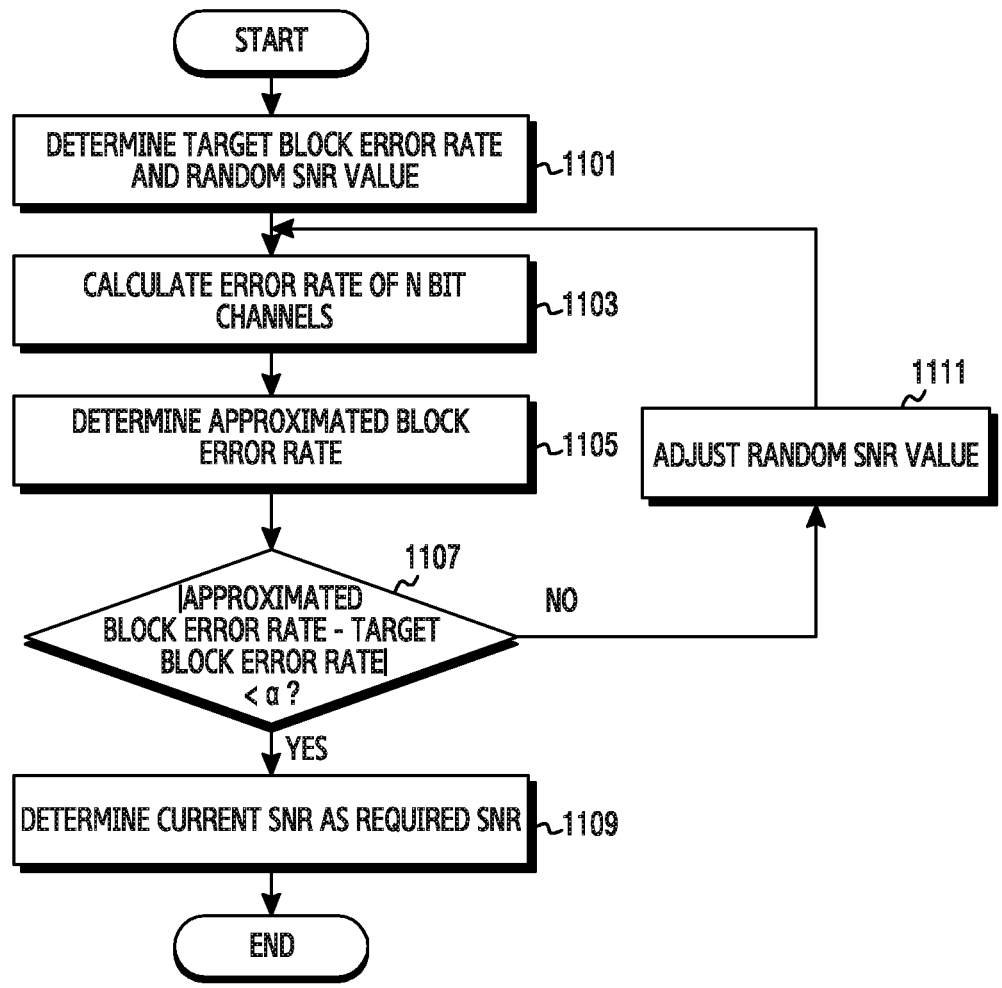
FIG. 11 illustrates a flow diagram for determining a required Signal Noise Ratio (SNR) according to the present disclosure.

FIG. 11 illustrates a flow diagram for determining a required Signal Noise Ratio (SNR) according to the present disclosure. The transmission device may determine a required SNR used for determining a repetition order in FIG. 11, through a flow diagram in FIG. 11.

Specifically, the transmission device may determine a target block error rate and a random SNR value, in step 1101. The target block error rate may be determined according to an adaptive transmission system. For example, in a HARQ system, the transmission device may determine the target block error rate to be 1%. The transmission device may configure and use a random SNR value in order to determine a required SNR.

In step 1103, the transmission device may determine an error rate of N bit channels, where N is any positive integer and is a value which may be changed according to a polar encoder. For example, it may be assumed that N=8. The transmission device may apply a given repetition transmission pattern, and determine an error rate of N bit channels by using the random SNR value configured in step 1101. Each bit channel error rate is an error rate for $u_i$ bits (1<i<N, and $u_0$ is an empty bit) when $u_1$ to $u_{i-1}$ are precisely known and may be calculated using a density evolution technique and so on. For example, the transmission device may use a pre-determined four repetition transmission patterns of $r_1, r_2, r_3$, and $r_4$ in order to determine a require SNR of bit index $r_5$ for fifth repetition transmission. The transmission device may apply the given repetition transmission patterns of $r_1, r_2, r_3$, and $r_4$ so as to determine error rates of N bit channels. For example, the transmission device may apply a density evolution technique so as to determine error rates of N bit channels.

In step 1105, the transmission device may determine an approximated block error rate. Specifically, the transmission device may add bit channel error rates for u bits corresponding to a given information set so as to determine an approximated block error rate. For example, when it is defined that an information set=$\{0, 0, 0, 0, 0, u_1, u_2, u_3\}$, the transmission device may add only bit channel error rates corresponding to $u_1, u_2$, and $u_3$ so as to determine an approximated block error rate.

In step 1107, the transmission device may determine whether an absolute value of the difference between the approximated block error rate and the target block error rate value is smaller than threshold value a, where a is any sufficiently small value which corresponds to a value presented for the reason that the approximated block error rate and the target block error rate value are unable to be exactly matched. The value of a may be changed according to an adaptive transmission system, and/or corresponds to a very small value which may be randomly configured by a user.

When an absolute value of the difference between the approximated block error rate and the target block error rate value is smaller than a, the transmission device moves to step 1109. In step 1109, the transmission device may determine the random SNR value determined in step 1101 as a required SNR for a repetition transmission pattern to which a random bit index has been applied.

When an absolute value of the difference between the approximated block error rate and the target block error rate value is smaller than a, the transmission device moves to step 1111. In step 1111, the transmission device may adjust a random SNR value. Specifically, the technical feature may increase or decrease the random SNR value determined in step 1101. For example, when the approximated block error rate is greater than the target block error rate value, the transmission device may adjust the random SNR value to be decreased. For another example, when the approximated block error rate is smaller than the target block error rate value, the transmission device may adjust the random SNR value to be increased.

Later, the transmission device may move to step 1103 and circularly repeat steps 1103 to 1107 so as to determine a final required SNR value.

Methods stated in claims and/or specifications according to various embodiments may be implemented by hardware, software, or a combination of hardware and software.

In the implementation of software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the present disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other types of optical storage devices, or a magnetic cassette. Alternatively, any combination of some or all of the above may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device which performs an embodiment of the present disclosure, via an external port. Further, a separate storage device on the communication network may access a device which performs an embodiment of the present disclosure.

In the above-described detailed embodiments of the present disclosure, a component included in the present disclosure is expressed in the singular or the plural according to a presented detailed embodiment. However, the singular form or plural form is selected for convenience of description suitable for the presented situation, and various embodiments of the present disclosure are not limited to a single element or multiple elements thereof. Further, either multiple elements expressed in the description may be configured into a single element or a single element in the description may be configured into multiple elements.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An operation method of a transmission device in a wireless communication system, comprising:
   obtaining a codeword from at least one information bit using a polar code;
   transmitting a packet including at least one bit of the codeword based on a puncturing order;
   in response to receiving a negative acknowledgment (NACK) for the packet, determining a repetition order for the at least one bit based on a difference between a block error rate associated with a bit-level error rate of the at least one bit and a target error rate; and
   transmitting a retransmission packet based on the repetition order.

2. The method of claim 1, wherein transmitting the packet comprises:
   transmitting, to a reception device, the codeword including a plurality of bits; and
   transmitting, to the reception device, the packet including at least one bit of the codeword.

3. The method of claim 2,
   wherein, if a number of the plurality of bits is smaller than a reference number, the codeword is designed based on the puncturing order.

4. The method of claim 2, further comprising transmitting, to the reception device, a message including information regarding the repetition order,
   wherein the repetition order is determined based on a bit-reversal calculation or a signal to noise ratio (SNR) or carrier to interference plus noise ratio (CINR).

5. The method of claim 1,
   wherein bits of the retransmission packet comprise a first set of bits determined based on the puncturing order and a second set of bits determined based on the repetition order.

6. The method of claim 5, wherein the first set of bits comprises at least one of the bits except for bits in the codeword based on the puncturing order,
   wherein the second set of bits comprises at least one bit that is alternately selected from each of synthesis channels based on the repetition order.

7. The method of claim 1, wherein the repetition order is determined such that the at least one bit is transmitted in an ascending order of a different between the block error rate associated with a bit-level error rate of the at least one bit and the target error rate.

8. An operation method of a reception device in a wireless communication system, comprising:
   receiving a packet including at least one bit of a codeword based on a puncturing order;
   decoding the packet received based on the puncturing order;
   in response to an occurrence of an error in the packet, transmitting a negative acknowledgment (NACK) for the packet; and
   receiving a retransmission packet based on a repetition order,
   wherein the codeword is obtained from at least one information bit using a polar code; and
   wherein the repetition order for the at least one bit is determined based on a difference between a block error rate associated with a bit-level error rate of the at least one bit and a target error rate.

9. The method of claim 8, further comprising receiving, from a transmission device, a message including information regarding the repetition order.

10. The method of claim 8, wherein the repetition order is determined based on a bit-reversal calculation or a signal to noise ratio (SNR) or carrier to interference plus noise ratio (CINR).

11. A transmission device in a wireless communication system, comprising:
    at least one processor configured to obtain a codeword from at least one information bit using a polar code; and
    at least one transceiver configured to transmit a packet including at least one bit of the codeword indicated by a puncturing order;
    in response to receiving a negative acknowledgment (NACK) for the packet, determine a repetition order for the at least one bit based on a difference between a block error rate associated with a bit-level error rate of the at least one bit and a target error rate; and
    transmitting a retransmission packet based on the repetition order.

12. The transmission device of claim 11, wherein the at least one transceiver is configured to:
    transmit, to a reception device, the codeword including a plurality of bits; and
    transmit, to the reception device, the packet including at least one bit of the codeword.

13. The transmission device of claim 12,
    wherein, if a number of the plurality of bits is smaller than a reference number, the codeword is designed based on the puncturing order.

14. The transmission device of claim 11, wherein the at least one processor is configured to control transmission of a message including information regarding the repetition order,
    wherein the repetition order is determined based on a bit-reversal calculation or a signal to noise ratio (SNR) or carrier to interference plus noise ratio (CINR).

15. The transmission device of claim 11, wherein bits of the retransmission packet comprise a first set of bits determined based on the puncturing order and a second set of bits determined based on the repetition order.

16. The transmission device of claim 15, wherein the first set of bits comprises at least one of the bits except for bits in the codeword based on the puncturing order,
    wherein the second set of bits comprises at least one bit that is alternately selected from each of synthesis channels based on the repetition order.

17. The transmission device of claim 11, wherein the repetition order is determined such that the at least one bit is transmitted in an ascending order of a different between the block error rate associated with a bit-level error rate of the at least one bit and the target error rate.

18. A reception device in a wireless communication system, comprising:
    at least one transceiver configured to receive a packet including at least one bit of a codeword indicated by a puncturing order; and
    at least one processor configured to decode the packet received based on the puncturing order;
    in response to occurring an error in the packet, transmit a negative acknowledgment (NACK) for the packet; and receive a retransmission packet based on a repetition order, wherein the codeword is obtained from at least one information bit using a polar code, and wherein the repetition order for the at least one bit is determined based on a difference between a block error rate associated with a bit-level error rate of the at least one bit and a target error rate.

19. The reception device of claim 18, wherein the at least one transceiver is configured to receive a message including information regarding the repetition order.

20. The reception device of claim 18, wherein the repetition order is determined based on a bit-reversal calculation, wherein the repetition order is determined based on a bit-reversal calculation or a signal to noise ratio (SNR) or carrier to interference plus noise ratio (CINR).

* * * * *